US012512611B2

(12) United States Patent
Baptiste

(10) Patent No.: US 12,512,611 B2
(45) Date of Patent: Dec. 30, 2025

(54) CONNECTOR FOR CONNECTING AN ELECTRICAL TERMINATION ON A PRINTED CIRCUIT, CORRESPONDING ASSEMBLY METHODS

(71) Applicant: BANKS AND ACQUIRERS INTERNATIONAL HOLDING, Suresnes (FR)

(72) Inventor: Régis Baptiste, Viarmes (FR)

(73) Assignee: BANKS AND ACQUIRERS INTERNATIONAL HOLDING, Suresnes (FR)

( * ) Notice: Subject to any disclaimer, the term of this patent is extended or adjusted under 35 U.S.C. 154(b) by 285 days.

(21) Appl. No.: 18/032,701

(22) PCT Filed: Oct. 14, 2021

(86) PCT No.: PCT/EP2021/078537
§ 371 (c)(1),
(2) Date: Apr. 19, 2023

(87) PCT Pub. No.: WO2022/084162
PCT Pub. Date: Apr. 28, 2022

(65) Prior Publication Data
US 2023/0396004 A1 Dec. 7, 2023

(30) Foreign Application Priority Data
Oct. 23, 2020 (FR) ...................................... 2010909

(51) Int. Cl.
*H05K 1/18* (2006.01)
*H01R 4/48* (2006.01)
(Continued)

(52) U.S. Cl.
CPC ............. *H01R 12/585* (2013.01); *H01R 4/48* (2013.01); *H01R 4/58* (2013.01); *H05K 1/18* (2013.01);
(Continued)

(58) Field of Classification Search
CPC ........... H05K 2201/10325; H05K 1/18; H01R 12/585
See application file for complete search history.

(56) References Cited

FOREIGN PATENT DOCUMENTS

| DE | 197 35 409 A1 | 3/1999 | |
|---|---|---|---|
| EP | 0 123 376 A2 | 10/1984 | |
| EP | 0748000 A2 * | 12/1996 | ........... H01R 13/187 |

OTHER PUBLICATIONS

English translation of EP0748000A2 (Year: 1996).*
Jan. 12, 2022 Search Report issued in International Patent Application No. PCT/EP2021/078537.

* cited by examiner

Primary Examiner — Jeremy C Norris
(74) Attorney, Agent, or Firm — Oliff PLC

(57) ABSTRACT

A connector for connecting an electrical termination to a printed circuit. The connector has the shape of a metal plate including: a peripheral area for fastening the connector on the printed circuit; a central orifice for inserting the electrical termination; retaining tabs for retaining the electrical termination, each retaining tab extending from the peripheral area towards the central orifice, and includes an elastically deformable portion attaching the retaining tab to the peripheral area and a free end forming an edge of the central orifice, the free end comprising a curve and a sharp edge, the curve and the sharp edge being respectively positioned opposite to each other so that the curve is oriented towards a first face, called removable assembly face, of the metal (Continued)

plate, and that the sharp edge is oriented towards a second face, called permanent assembly face, of the metal plate, opposite to the first face.

16 Claims, 5 Drawing Sheets

(51) Int. Cl.
 *H01R 12/58* (2011.01)
 *H01R 4/58* (2006.01)
(52) U.S. Cl.
 CPC ................ *H05K 2201/1025* (2013.01); *H05K 2201/1031* (2013.01); *H05K 2201/10333* (2013.01); *H05K 2201/1059* (2013.01)

CONNECTOR FOR CONNECTING AN ELECTRICAL TERMINATION ON A PRINTED CIRCUIT, CORRESPONDING ASSEMBLY METHODS

TECHNICAL FIELD

The field of the invention is that of electrical connection devices. More particularly, the invention relates to the field of connectors which make it possible to connect an electrical termination, such as a tab of an electronic component or the end of an electric wire, on a printed circuit.

PRIOR ART

Many solutions exist when it comes to connecting components or electric wires on a printed circuit.

A first conventional connection solution is to solder the electrical terminations (tabs of the component or stripped ends of electric wires for example) directly on the printed circuit. However, this solution has some drawbacks. For example, it does not allow easy dismantling of the mounted component, since it is necessary to unsolder it to remove it, with the risk of damaging the printed circuit during this operation. Moreover, in some situations (particular design of the electronic component or of the printed circuit for example) it is sometimes complicated to carry out direct soldering of the component on the printed circuit.

A second connection solution is based on the use of connection sockets. Previously soldered or crimped in the printed circuit, these sockets are used to accommodate and retain the electrical terminations of the components or electric wires to be connected to the printed circuit. The implementation of such a connection solution is however sometimes restrictive. Firstly, the size of the sockets, and in particular their height, ensure that they are not suitable for many types of electronic assemblies. Secondly, the installation of these sockets often requires the use of a specific crimping tool. Thirdly, it is common for these connection sockets to be designed to cooperate with a specific male part, mounted on the electrical termination to be connected: the electrical termination cannot therefore be inserted as it is in the connection socket, which complicates the mounting.

A third connection solution consists in implementing the electrical connection by means of an elastic or spring contact connector. This type of connectors (ball connector or spring pushers, for example) is mounted in compression on the printed circuit, so as to maintain electrical contact. Such connectors are, however, by nature relatively bulky (both in height and in terms of surface area on the printed circuit), and their use often requires the provision of a counter-support element on the other face of the printed circuit, in order to avoid the bending of the latter under the continuous pressure of the contact. Furthermore, the implementation of this type of connection still most often requires the use of two specific complementary parts to ensure the electrical connection.

Thus, the existing solutions for connecting an electrical termination on a printed circuit have several drawbacks. Many of them are based on the implementation of very specific connectors, in this regard that a connector adapted for the connection of a type of electrical termination (a flexible wire, or an electrical termination of particular diameter for example) is generally not suitable for the connection of another type of electrical termination (a rigid wire, or an electrical termination of another diameter for example). In addition to suffering from a lack of universality, these specific connectors are often expensive, bulky, and the source of many constraints in terms of mounting (strict solutions imposing, for example, a mounting on one face of the printed circuit, need to use special tools for crimping a part of the connector on the printed circuit, making the mounting more complicated due to the fact that the connector comprises a male part and a female part, etc.). The alternative solution consisting of not using a specific connector and directly soldering the electrical termination on the printed circuit, although not presenting the same constraints, does not overcome drawbacks either: it is not always suitable for the connection of some electronic components, and it does not allow easy and quick dismantling of the component once it is mounted.

There is therefore a need for a type of connectors allowing the connection of an electrical termination on a printed circuit, which does not have at least some drawbacks of the connectors of the prior art. More particularly, there is a need for a new type of connectors that is little bulky, inexpensive, easy to manufacture, simple to use, and which is suitable for use in a wide variety of mounting contexts.

SUMMARY OF THE INVENTION

The present technique makes it possible to partly solve the problems raised by the prior art. Indeed, the present technique relates to a connector for the connection of an electrical termination on a printed circuit, the connector taking the form of a metal plate which comprises:
- a peripheral area for fastening said connector on said printed circuit;
- a central orifice for inserting said electrical termination;
- a plurality of retaining tabs for retaining said electrical termination, each of said retaining tabs extending from said peripheral area towards said central orifice, and comprising an elastically deformable portion by which the retaining tab is connected to said peripheral area and a free end forming an edge of said central orifice, said free end comprising a curve and a sharp edge, said curve and said sharp edge being respectively positioned opposite to each other so that said curve is oriented towards a first face, called removable assembly face, of said metal plate, and that said sharp edge is oriented towards a second face, called permanent assembly face, of said metal plate, opposite to said first face.

In this way, the connector according to the proposed technique is less expensive and easier to manufacture than the connectors of the prior art, while offering greater flexibility of use.

In a particular embodiment, each of said retaining tabs further comprises a rim of a "V"-shaped section, which attaches the elastically deformable portion of the retaining tab to the free end of the retaining tab.

In a particular embodiment, said metal plate has a circular shape.

In a particular embodiment, said metal plate comprises at least three retaining tabs.

In a particular embodiment, said retaining tabs are evenly distributed around said central orifice.

In a particular embodiment, at least one among said removable assembly face and said permanent assembly face comprises a legend associated with a distinctive sign.

In a particular embodiment, said metal plate is made of steel or beryllium copper alloy.

In a particular embodiment, the width and the length of the metal plate, when the metal plate has a rectangular parallelepiped shape, or the diameter of the metal plate, when the metal plate has a circular shape, are comprised between 2.5 and 4 millimeters; the thickness of the connector is comprised between 0.1 and 0.4 millimeters; and the internal diameter of the central orifice is comprised between 0.4 and 0.8 millimeters.

According to another aspect, the present technique also relates to a method for removably assembling an electrical termination on a printed circuit, by means of a connector as previously described, said method being characterized in that it comprises:
- a step of fastening said connector on said printed circuit, at the level of the peripheral area of said connector, said connector being positioned so that its central orifice is opposite to an insertion hole provided in said printed circuit and intended to accommodate said electrical termination;
- a step of inserting said electrical termination into said central orifice, said insertion being carried out on the side of the removable assembly face of said connector.

According to yet another aspect, the present technique also relates to a method for permanently assembling an electrical termination on a printed circuit, by means of a connector as previously described, said method being characterized in that it comprises:
- a step of fastening said connector on said printed circuit, at the level of the peripheral area of said connector, said connector being positioned so that its central orifice is opposite to an insertion hole provided in said printed circuit and intended to accommodate said electrical termination;
- a step of inserting said electrical termination into said central orifice, said insertion being carried out on the side of the permanent assembly face of said connector.

The different embodiments mentioned above can be combined with each other for the implementation of the invention.

FIGURES

Other features and advantages of the invention will appear more clearly on reading the following description of a preferred embodiment of the invention, given by way of a simple illustrative and non-limiting example, and the appended drawings, among which:

Figure 6:
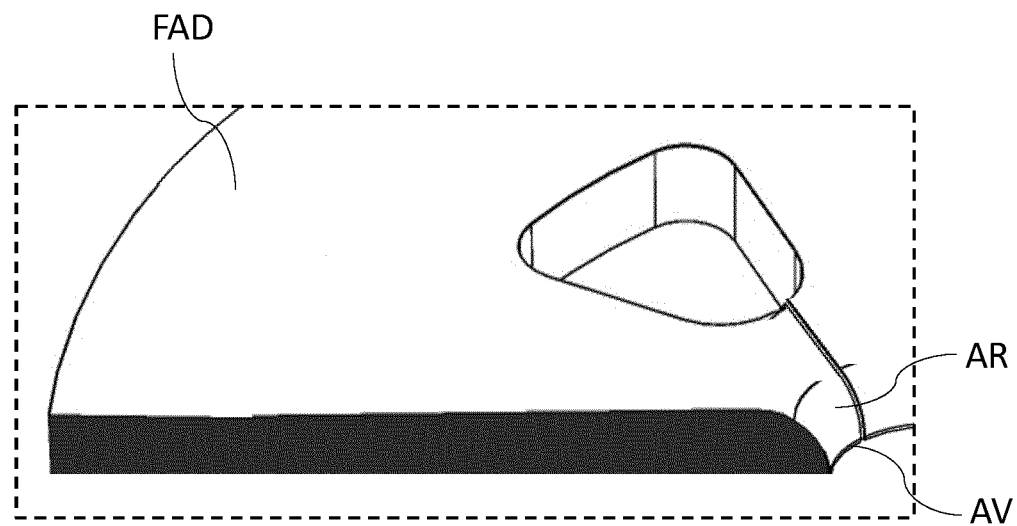
Figure 2A:
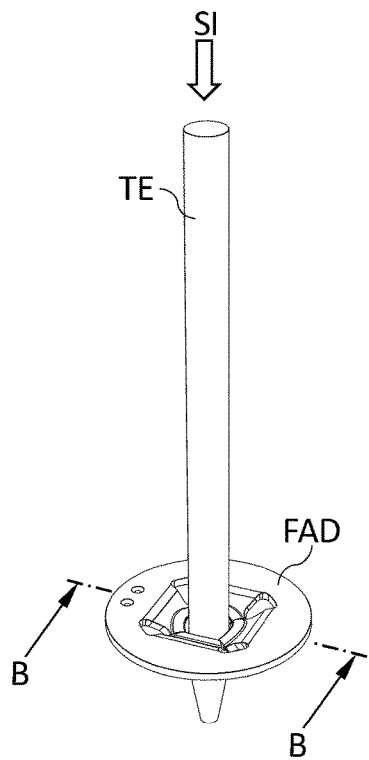
Figure 2B:
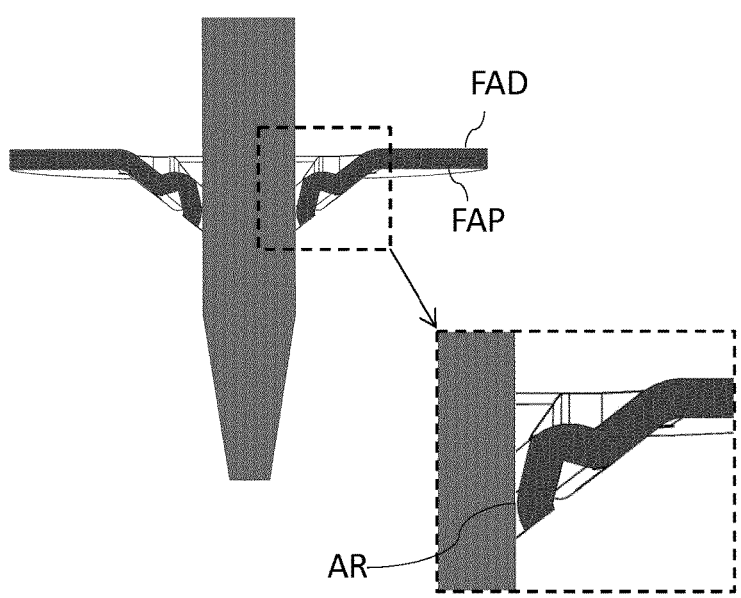
Figure 3A:
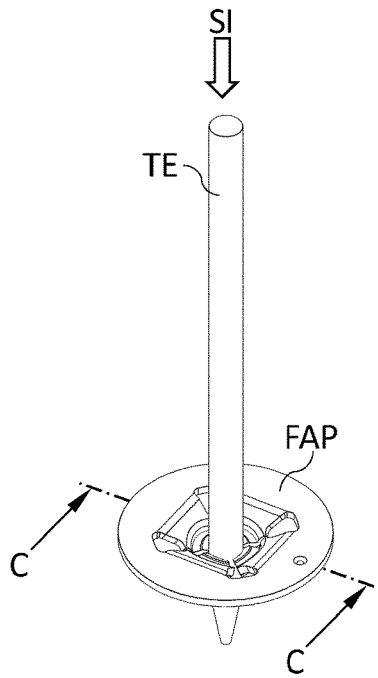
Figure 3B:
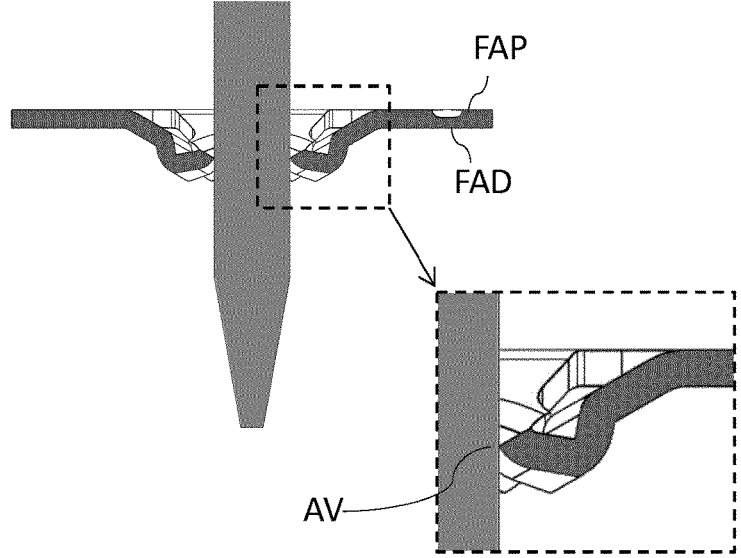
Figure 4:
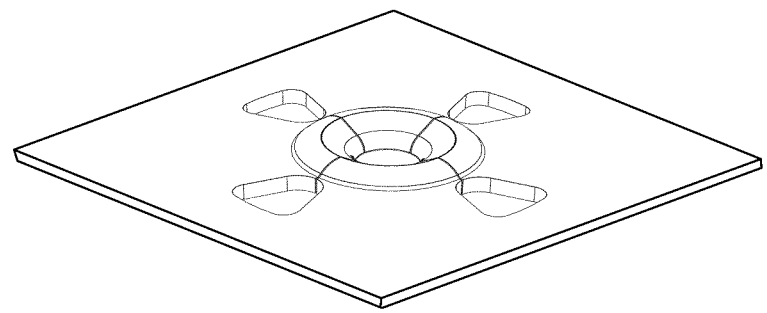
Figure 5:
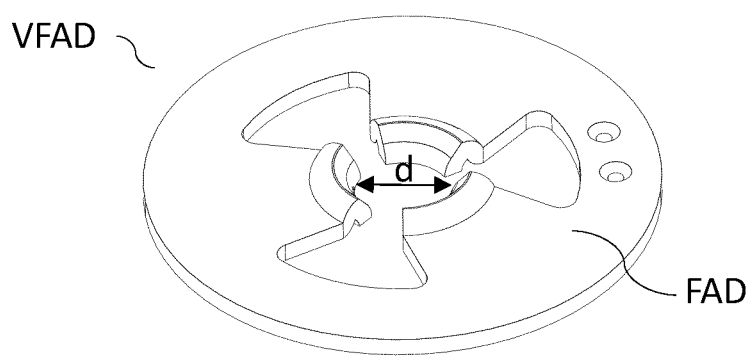
Figure 5:
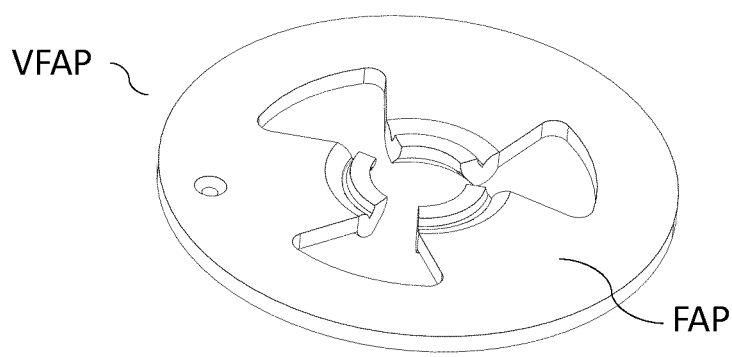
Figure 7:
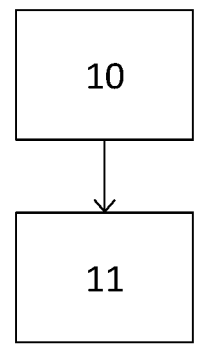
Figure 8:
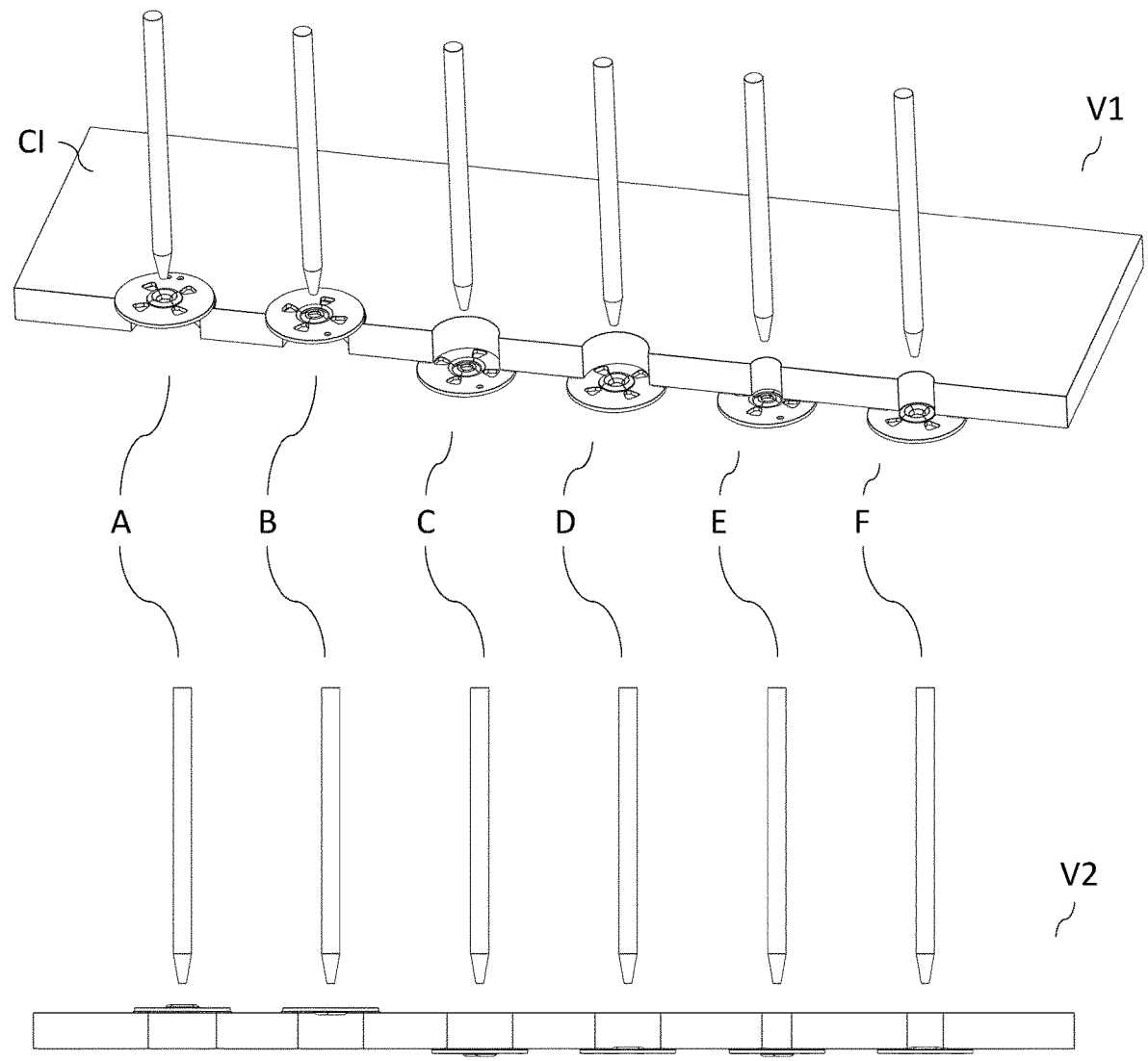

FIG. 2a presents a perspective view of an assembly of the removable assembly type of an electrical termination and a connector, in a particular embodiment of the proposed technique;

FIG. 2b is a truncated sectional view of the removable assembly illustrated in relation with FIG. 2a, according to the section plane embodied by the axis B-B visible in FIG. 2a, in a particular embodiment of the proposed technique;

FIG. 3a presents a perspective view of an assembly of the permanent assembly type of an electrical termination and a connector, in a particular embodiment of the proposed technique;

FIG. 3b is a truncated sectional view of the permanent assembly illustrated in relation with FIG. 3a, according to the section plane embodied by the C-C axis visible in FIG. 3a, in a particular embodiment of the proposed technique;

FIG. 4 shows a perspective view of another connector, in a particular embodiment of the proposed technique;

FIG. 5 shows two views of another connector (a perspective view of a first face of the connector and a perspective view of a second face of the connector, opposite to the first face), in a particular embodiment the proposed technique;

FIG. 6 shows a truncated sectional view of a retaining tab of a connector, in another particular embodiment of the proposed technique;

FIG. 7 illustrates the different steps of a method for assembling an electrical termination on a printed circuit, by means of a connector according to the proposed technique, in a particular embodiment;

FIG. 8 illustrates different connection configurations of an electrical termination on a printed circuit by means of a connector according to the proposed technique, in various particular embodiments.

DETAILED DESCRIPTION OF THE INVENTION

The proposed technique relates to a connector for ensuring the mounting and the electrical connection of an electrical termination on a printed circuit. The term "electrical termination" is understood herein in a broad sense, and covers both a connection tab of an electronic component to be pricked, and the end of a flexible or rigid electric wire, a tinned wire, a wire with crimped insert (e.g. with a lug or a terminal end), or even the end of an antenna for example.

Throughout the description and in the figures, elements of the same nature are identified by the same reference.

Figure 1A:
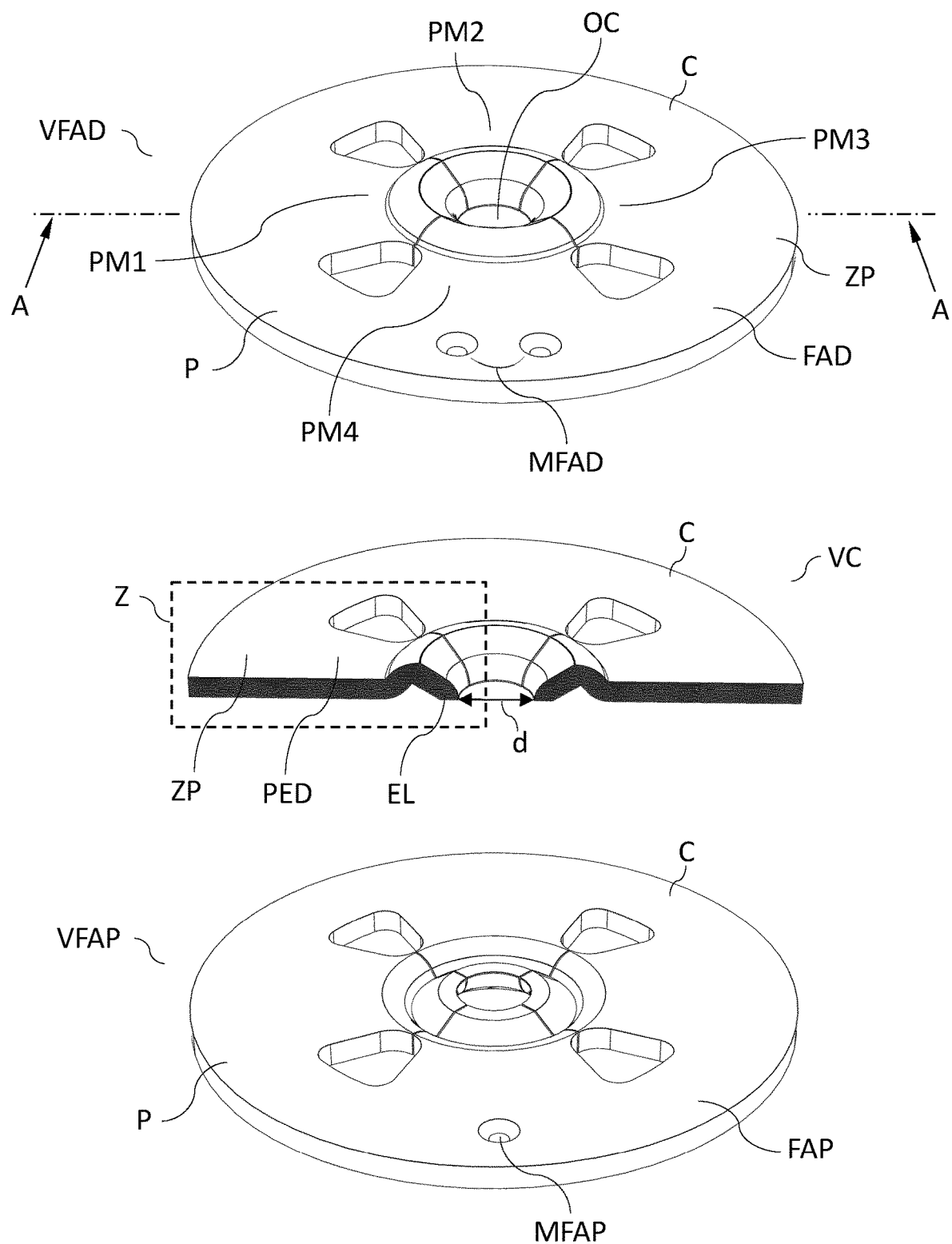
FIG. 1a shows three views of the same connector (a perspective view of a first face of the connector, a perspective view of a second face of the connector, opposite to the first face, and a sectional and in perspective view performed according to the section plane embodied by the axis A-A visible on the view of the first face), in a particular embodiment of the proposed technique.

A connector according to the proposed technique is illustrated in relation to FIG. 1a, in a particular embodiment. The connector C takes the shape of a metal plate P, that is to say a substantially flat metal piece (or at the very least flat over most of its surface), and whose thickness is small in comparison with its other dimensions. More particularly, FIG. 1a shows three views of the same connector: a perspective view VFAD of a first face FAD of the connector, a perspective view VFAP of a second face FAP of the connector, and a sectional view VC made according to the section plane embodied by the A-A axis visible on the view VFAD. The first face FAD and the second face FAP correspond to the two main opposite faces of the metal plate P. The metal plate P comprises a plurality of retaining tabs (at least two according to the general principle of the proposed technique, and four in the particular embodiment illustrated in FIG. 1a: PM1, PM2, PM3 and PM4) which extend from a peripheral area ZP of the metal plate towards a central through orifice OC arranged in the center of the metal plate. In a particular embodiment, these retaining tabs are all shaped and dimensioned substantially identically, and they are evenly distributed around the central orifice OC. According to a particular feature, the retaining tabs are formed directly in the metal plate P, by means of adapted cutouts (e.g. cut lines and/or slots) of the metal plate. Each of the retaining tabs comprises an elastically deformable portion PED, by which it is attached to the peripheral area ZP of the metal plate, and a free end EL forming an edge of the central orifice OC. The free ends EL of the retaining tabs thus delimit together an area of the substantially circular central orifice, having a diameter d when the elastically deformable portions are not deformed. This diameter d is referred to as the internal diameter of the central orifice in the remainder of the document.

The flexible nature of the elastically deformable portion PED is obtained by adjusting various parameters such as, for example, the material of the metal plate, the thickness of the metal plate and/or the width of the retaining tab. In this manner, the elastically deformable portion is made capable of deforming under the exercise of an external pressure force, then of regaining its initial shape corresponding to a state of rest when said external pressure force is no longer applied, under the effect of an elastic return force intrinsic to the used material. Thanks to these elastically deformable portions, it is possible to insert into the central orifice of the connector an electrical termination of substantially circular section and the diameter of which is greater than the internal diameter of the central orifice. The elastic return force of the elastically deformable portions—then deformed—allows, in this case, the electrical termination to be retained in the connector, as described later in relation to FIGS. 2a, 2b, 3a and 3b. This design of the retaining tabs also advantageously allows a connector according to the proposed technique to be able to support several diameters of electrical terminations, the elastically deformable portions being simply more or less deformed, depending on whether the diameter of the electrical termination accommodated in the central orifice is more or less large (but, in any event, at least greater than the internal diameter of the central orifice, otherwise the retaining is no longer ensured). This design of the retaining tabs also allows the connector to be able to accommodate, if necessary, electrical terminations whose section is not necessarily circular (e.g. square or even rectangular sections).

Figure 1B:
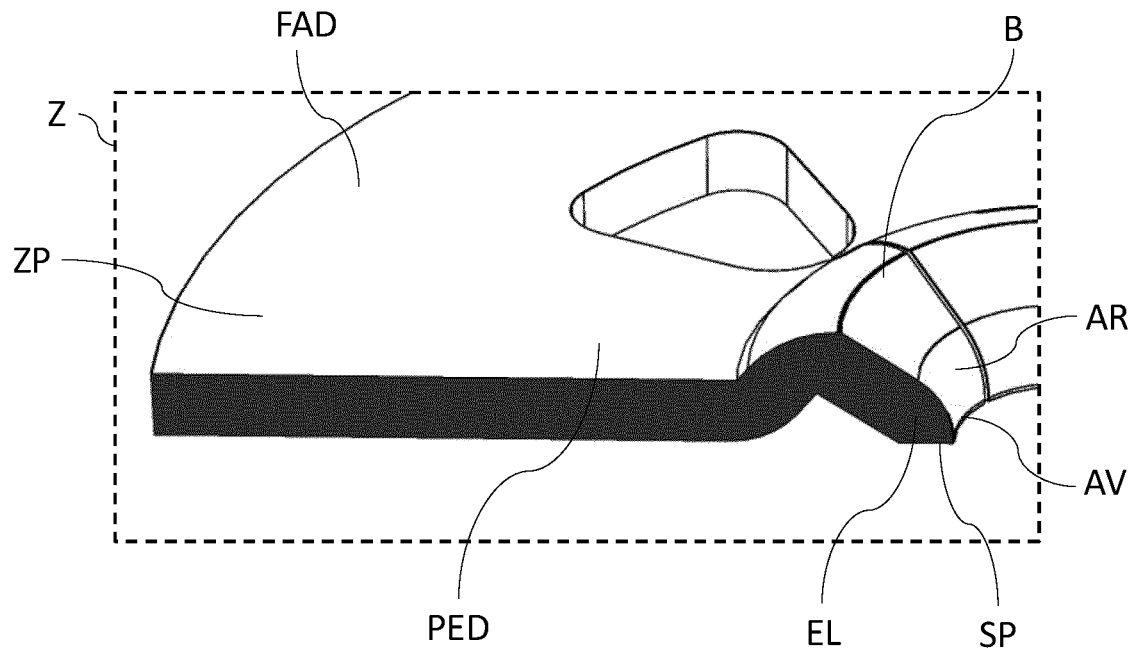
FIG. 1b is an enlarged view of a portion of the sectional view of FIG. 1a, presenting in more detail a retaining tab of the connector of FIG. 1a, in a particular embodiment of the proposed technique.

FIG. 1b shows an enlarged view of part Z of sectional view VC of FIG. 1a, making it possible to better highlight the features of a retaining tab, and in particular of its free end EL, in a particular embodiment. According to the general principle of the proposed technique, the free end EL of a retaining tab comprises at least one curve AR (i.e. a rounded surface) and at least one sharp edge AV. the curve AR and the sharp edge AV are located on the periphery of the central orifice OC (in other words, they define an edge thereof), and are respectively positioned opposite to each other such that the curve AR is oriented towards the first face FAD of the metal plate and the sharp edge AV is oriented towards the second face FAP of the metal plate. In other words, when considering the relative position of these two elements once the elastically deformable portion PED of the retaining tab is at rest (i.e. not deformed, because no electrical termination is yet inserted in the central orifice OC of the connector), the curve AR is located on the side of the first face FAD of the connector while the sharp edge AV is located on the side of the second face FAP of the connector. According to a particular feature, the sharp edge AV results from the intersection between the curve AR and a flat surface SP of the free end EL, located on the side of the second face FAP of the connector, the curve AR and the flat surface SP then being preferably configured to form, together, at the level of the sharp edge AV, an acute angle. These general features of the free ends of the retaining tabs—a curve, a sharp edge, and their respective positioning—make it possible to provide different functions on each of the two main faces of the connector: as it is now detailed in relation to FIGS. 2a, 2b, 3a and 3b, the first face FAD can thus be described as the "removable assembly face" of the connector, and the second face FAP as the "permanent assembly face" of the connector.

FIGS. 2a, 2b, 3a and 3b illustrate more particularly the way in which the retaining tabs of a connector such as the one presented in relation to FIGS. 1a and 1b are deformed when an electrical termination is inserted into the central orifice of the connector, depending on the side of the connector through which the electrical termination is inserted (the electrical termination having a section with a diameter greater than the internal diameter of the central orifice of the connector).

In the situation represented in relation to FIGS. 2a and 2b, the electrical termination TE is inserted into the central orifice from the face of the connector towards which the curves AR of the free ends of the retaining tabs are oriented: in other words, the insertion is therefore carried out on the side of the removable assembly face FAD of the connector. FIG. 2a presents a perspective view of such an assembly (an arrow illustrating the direction of insertion SI of the electrical termination TE into the connector), while FIG. 2b shows truncated and enlarged cross-section views of this assembly, according to the section plane embodied by the axis B-B visible in FIG. 2a. When inserting the electrical termination TE into the connector, due to the fact that the diameter of the electrical termination is greater than the internal diameter of the central orifice of the connector, the elastically deformable portions of the retaining tabs deform under the action of the pressure exerted by the electrical termination on the free ends of the retaining tabs. The free ends of the retaining tabs are pushed towards the face of the connector that is opposite to the face by which the electrical termination is inserted into the connector. In the case, described herein, of an insertion through the removable assembly face FAD, the contact between the connector and the electrical termination TE is then established at the level of the curve AR of the free ends of the retaining tabs, as shown in the FIG. 2b. With this type of contact at the level of a curved area of the connector, which promotes sliding, the sliding of the electrical termination in the central orifice remains possible. In particular, by applying to the electrical termination an extraction force in the opposite direction to the direction of insertion SI, it is possible to remove the electrical termination TE from the connector without degrading the connector. Used in this context, the connector therefore makes it possible to perform an assembly of the "removable assembly" type of an electrical termination on a printed circuit on which the connector would be fastened: the electrical termination can be removed without damaging the connector, and it is thus possible to disconnect and reconnect an electrical termination in the connector on many occasions.

In the situation represented in relation to FIGS. 3a and 3b, the electrical termination TE is inserted into the central orifice from the face of the connector towards which the sharp edges AV of the free ends of the retaining tabs are oriented: in other words, the insertion is therefore carried out on the side of the permanent assembly face FAP of the connector. FIG. 3a shows a perspective view of such an assembly (an arrow illustrating the direction of insertion SI of the electrical termination TE into the connector), while FIG. 3b shows truncated and enlarged sectional views of this assembly, along the section plane embodied by the C-C axis visible in FIG. 3a. When inserting the electrical termination TE into the connector, due to the fact that the diameter of the electrical termination is greater than the internal diameter of the central orifice of the connector, the elastically deformable portions of the retaining tabs deform under the action of the pressure exerted by the electrical termination on the free ends of the retaining tabs. The free ends of the retaining tabs are pushed towards the face of the connector that is opposite to the face by which the electrical termination is inserted into the connector. In the case, described herein, of an insertion through the permanent assembly face FAP, the contact between the connector and the electrical termination TE is then established at the level of the sharp edges AV of the free ends of the retaining tabs, as shown in figure FIG. 3b. With this type of contact, the removal the electrical termination from the connector is made difficult, because of the "claw" effect exerted by the sharp edges of the retaining tabs on the electrical termination. In particular, even by applying to the electrical termination a force in the opposite direction to the direction of insertion SI, it is not possible to remove the electrical termination TE from the connector without significantly damaging the connector or without tearing it from the printed circuit on which it would be fastened. Used in this context, the connector therefore makes it possible to produce an assembly of the "permanent assembly" type of an electrical termination on a printed circuit: the electrical termination cannot be removed from the connector without irreversible deformation or destruction of at least part of the mounting.

Depending on the face of the connector through which an electrical termination is inserted, the connector therefore makes it possible to perform either a removable assembly, or else a permanent assembly, which gives the connector great flexibility of use.

In order to promote the "sliding" effect (case of the removable assembly of FIGS. 2a and 2b) or to accentuate the "claw" effect (case of the permanent assembly of FIGS. 3a and 3b) of the retaining tabs on the electrical termination, additional special features can be implemented, in particular as regards the shape of the retaining tabs. Thus, in the particular embodiment illustrated in relation to FIGS. 1a and 1b, each retaining tab also comprises a rim B of a "V"-shaped section, which attaches its substantially planar elastically deformable portion PED, to its end free EL. More particularly, as illustrated in FIG. 1b in particular, the rim B is attached to the elastically deformable portion PED at the level of the end of one of the two branches of the "V" shape, the free end EL of the retaining tab is carried by the other branch of the "V" shape (the body of this branch bearing for example the curve AR, and the end of this branch bearing the sharp edge AV), and the tip of the "V" shape is oriented towards the first face FAD of the connector. The advantage of such a configuration is clearly visible in FIGS. 2b and 3b. Thus, as shown in FIG. 2b, when the electrical termination is inserted through the removable assembly face FAD of the connector, the branch of the "V" shape of the rim B which carries the free end of the retaining tab—and more particularly the curve AR at which the contact is then established—is substantially tangent to the surface of the electrical termination TE inserted into the connector, which makes it possible to promote its sliding (and this even in the event of slight deformations of the retaining tab due to friction during the application of an extraction force on the electrical termination in the direction opposite to the direction of insertion SI). However, as shown in FIG. 3b, when the electrical termination is inserted through the permanent assembly face FAP of the connector, the branch of the "V" shape of the rim B which carries the free end of the retaining tab—and more particularly the sharp edge AV at which the contact is then established—is substantially perpendicular to the surface of the electrical termination TE inserted into the connector, which makes it possible to maintain and accentuate the "claw" effect even in case of deformation of the retaining tab due to an attempt to extract the electrical termination, by applying an extraction force in the opposite direction to the direction of insertion SI.

In a particular embodiment, in order to allow a user to better distinguish the removable assembly face from the permanent assembly face when using the connector—and thus reduce the risk of being mistaken in the type of assembly (removable vs. permanent)—at least one of these two faces comprises a legend associated with a distinctive sign. According to a particular feature, one of the faces comprises a legend associated with a distinctive sign, and the other does not. Alternatively, according to another particular feature, each of the two faces comprises a legend, the removable assembly face having a legend associated with a first distinctive sign, and the permanent assembly face having a legend associated with a second distinctive sign, different from the first distinctive sign. FIG. 1a shows an example of this type, with a MFAD legend marked with two points etched on the removable assembly face FAD of the connector, and a MFAP legend marked with a single point etched on the permanent assembly face FAP of the connector. Such legend can also be used during the quality control of a printed circuit comprising one or more connectors according to the proposed technique, in order to check, possibly in an automated way, that the assembly has been carried out in the expected direction (removable vs. permanent).

In the embodiment illustrated in FIGS. 1a and 1b, the metal plate—and therefore more generally the connector—has a circular shape and comprises four retaining tabs. In addition, each retaining tab comprises a rim of a "V"-shaped section attaching the elastically deformable portion of the retaining tab to its free end. This example is however purely illustrative and not limiting. In particular, other connector shapes and a different number of retaining tabs can be envisaged without departing from the scope of the proposed technique, such as for example a connector formed in a metal plate of generally rectangular parallelepiped shape, as illustrated in relation with FIG. 4, or even a connector comprising three retaining tabs, as illustrated in relation with FIG. 5. A connector having a circular shape, however, has the advantage of not having a radial mounting direction. Similarly, a connector comprising at least three retaining tabs (and not only two retaining tabs, for example) ensures better stability and better retention of the electrical termination inserted therein. In the same order of considerations, shapes of intermediate portion other than a rim of "V" section can be considered to attach the elastically deformable portion of a retaining tab to its free end, said shapes could be simpler as illustrated in relation with FIG. 6, or more complicated. However, a "V"-section rim as described in relation to FIG. 1b offers a good compromise, by making it possible both to ensure effective maintaining of an electrical termination inserted in the connector, to contribute to obtaining a satisfactory sliding effect (during a removable type assembly) and a satisfactory "claw" effect (during a permanent type assembly), while maintaining a relatively simple shape to manufacture.

According to another aspect, the proposed technique also relates to a method of assembling an electrical termination on a printed circuit, by means of a connector as previously described. Such an assembly method comprises two main steps, illustrated in relation to FIG. 7.

In a first step 10, the connector is fastened on the printed circuit, at the level of a substantially planar peripheral area of the connector. More particularly, depending on the desired assembly configuration (of which various examples are presented later in relation to FIG. 8), the connector is soldered to a suitable contact pad of the printed circuit, either at the level of the peripheral area of the removable assembly face of the connector, or at the level of the peripheral area of the permanent assembly face of the connector. Furthermore, during this fastening step 10, the connector is positioned so that its central orifice is located opposite an insertion hole provided in said printed circuit and intended to accommodate the electrical termination to be connected.

In a second step 11, an electrical termination is inserted into the central orifice of the connector. This electrical termination has a diameter greater than the internal diameter of the central orifice. As presented hereinabove, the pressure exerted by the electrical termination on the retaining tabs during this insertion causes the elastic deformation of the elastically deformable portions of the retaining tabs. Once the insertion movement has been finalized, the retaining tabs retain the electrical termination in the associated insertion hole of the printed circuit (by the effect of the elastic return force), as well as its electrical connection to the contact pad of the printed circuit (via the retaining tabs, the connector being made of metal).

More particularly, a connector according to the proposed technique makes it possible to implement two types of assembly, depending on the side of the connector through which the electrical termination is inserted in step 11: a removable assembly when the insertion of the electrical termination is carried out on the side of the removable assembly face of the connector, or a permanent assembly when the insertion of the electrical termination is carried out on the side of the permanent assembly face of the connector.

There are presented in relation to FIG. 8, in a perspective view V1 and a front view V2, some examples of different possible mounting configurations of an electrical termination on a printed circuit C1 by means of the same connector according to the proposed technique. More particularly, the connector used in these particular embodiments is the circular connector with four retaining tabs already described in relation to FIGS. 1a and 1b. In the different configurations A, B, C, D, E and F illustrated, the electrical termination is presented just before its insertion into the connector, on the side where it will be inserted. The connector is also already fastened on the printed circuit, its central orifice positioned opposite to a corresponding insertion hole of the printed circuit. The printed circuit is presented in a sectional view, in order to better highlight the way in which the connector is laid out.

The configurations A, D and F correspond to an assembly of the removable assembly type: indeed, in these configurations, the electrical termination is presented on the side of the removable assembly face of the connector.

Conversely, the configurations B, C and E correspond to an assembly of the permanent assembly type: indeed, in these configurations, the electrical termination is presented on the side of the permanent assembly face of the connector.

As shown in these different examples of configurations, the connector according to the proposed technique also offers various other assembly latitudes. For example, it allows, if the context requires it and as illustrated on the configurations C, D, E and F, mounting the connector on one face of the printed circuit, but inserting the electrical termination via the other opposite face of the printed circuit (the connector and the connected component are then located on either side of the printed circuit, which can prove to be useful in particular in the event of limited available surface on one of the faces of the printed circuit). The same connector (i.e. of the same dimensions) can also be used in connection with different diameters of insertion holes of a printed circuit. For example, the configurations E and F show a fastening of the connector so as to be opposite to the insertion holes of smaller diameters than those of the configurations A, B, C and D. By thus varying the respective dimensions of the connector and the diameter of the insertion hole of the printed circuit opposite which it is positioned, it is possible to adjust the retaining force exerted by the retaining tabs on the electrical termination. Indeed, with a smaller insertion hole, it is possible to artificially reduce the length of the elastically deformable portion of the retaining tabs, by welding a larger surface of the peripheral area of the connector, which has the effect of making more rigid the retaining tabs. A smaller insertion hole also makes it possible to more closely guide the electrical termination inserted therein, and thus contribute to a better stability of this electrical termination while reducing the stresses undergone by the connector, in particular in the event of a fall of the assembly.

As shown in connection with the various embodiments previously presented, the connector according to the proposed technique therefore offers numerous advantages. First, it is little bulky. More particularly, in a particular embodiment, the width and the length of the connector (when the latter has a rectangular parallelepiped shape) or its diameter (when the connector is circular) are comprised between 2.5 and 4 millimeters, the thickness of the connector is comprised between 0.1 and 0.4 millimeters, and the internal diameter of the central orifice is comprised between 0.4 and 0.8 millimeters. The connector is therefore very compact in height, and its grip on the surface of the printed circuit is small. Secondly, the connector is inexpensive and easy to manufacture. More particularly, the connectors according to the proposed technique can be manufactured simply, on a large scale and at a lower cost, thanks to the implementation of known techniques for cutting and embossing metal plates (or sheets). The production of these connectors can in particular be carried out with a follow-on tool, guaranteeing reliable and precise repeatability, with the possibility of supplying these connectors in strip, roll, or reel. In a particular embodiment, the connector is made of steel or beryllium copper alloy, possibly with tin or gold plating, in order to guarantee good performance both in terms of mechanical strength and electrical conductivity. Thirdly, the proposed connector is easy to use, since it comes in the form of a single piece to be soldered on the printed circuit, and the connection of an electrical termination by means of such a connector is a very simple operation to perform, essentially by inserting the electrical termination into the central orifice of the connector. Fourthly, as it has been shown in particular in relation to FIG. 8, the same connector is suitable for being used in a wide variety of mounting contexts: thus, for example, the assembly can be removable or permanent, the assembly can be made on one face or on the other face of the printed circuit, an electronic component and the connector in which it is held can be positioned on the same face or on opposite faces of the printed circuit, the connector supports several diameters of electrical terminations, etc. The connector according to the proposed technique therefore offers many advantages against the connectors of the prior art.

The invention claimed is:

1. A connector for connecting an electrical termination to a printed circuit, wherein the connector comprises a metal plate comprising:
   a peripheral area for fastening the connector on the printed circuit;

a central orifice for inserting the electrical termination and having an internal diameter smaller than an external diameter of the electrical termination;

a plurality of retaining tabs for retaining the electrical termination, each of the retaining tabs extending from the peripheral area towards the central orifice, and comprising an elastically deformable portion whereby the retaining tab is attached to the peripheral area and a free end forming an edge of the central orifice, the free end comprising a curved edge and a sharp edge, the curved edge and the sharp edge being respectively positioned opposite to each other so that the curved edge is oriented towards a removable assembly face of the metal plate, and that the sharp edge is oriented towards a permanent assembly face of the metal plate, opposite to the permanent assembly face, wherein:

the free ends of the retaining tabs delimit together the central orifice, the respective sharp edges of the free ends of the retaining tabs are configured to establish an electrical contact between the connector and the electrical termination and prevent removal of the electrical termination from the connector without irreversible deformation or destruction of at least a part of the connector, when the electrical termination is inserted into the central orifice from the permanent assembly face, and the respective curved edges of the free ends of the retaining tabs are configured to establish an electrical contact between the connector and the electrical termination and allow removal of the electrical termination from the connector without damaging the connector, when the electrical termination is inserted into the central orifice from the removable assembly face.

2. The connector according to claim 1, wherein each of the retaining tabs further comprises a rim of "V"-shaped section, which attaches the elastically deformable portion of the retaining tab to the free end of the retaining tab.

3. The connector according to claim 1, wherein the metal plate is circular.

4. The connector according to claim 1, comprising at least three retaining tabs.

5. The connector according to claim 1, wherein the retaining tabs are evenly distributed around the central orifice.

6. The connector according to claim 1, wherein at least one of the removable assembly face and the permanent assembly face comprises a legend associated with a distinctive sign.

7. The connector according to claim 1, wherein the metal plate is made of steel or beryllium copper alloy.

8. The connector according to claim 1, wherein:

the metal plate has a width and a length, when the metal plate has a rectangular parallelepiped shape, or a diameter, when the metal plate has a circular shape, between 2.5 and 4 millimeters;

the connector has a thickness between 0.1 and 0.4 millimeters;

the central orifice has an internal diameter between 0.4 and 0.8 millimeters.

9. A method for removably assembling an electrical termination on a printed circuit, by means of a connector comprises a metal plate comprising:

a peripheral area for fastening the connector on the printed circuit;

a central orifice for inserting the electrical termination and having an internal diameter smaller than an external diameter of the electrical termination;

a plurality of retaining tabs for retaining the electrical termination, each of the retaining tabs extending from the peripheral area towards the central orifice, and comprising an elastically deformable portion whereby the retaining tab is attached to the peripheral area and a free end forming an edge of the central orifice, the free end comprising a curved edge and a sharp edge, the curved edge and the sharp edge being respectively positioned opposite to each other so that the curved edge is oriented towards a removable assembly face of the metal plate, and that the sharp edge is oriented towards a permanent assembly face of the metal plate, opposite to the permanent assembly face, wherein:

the free ends of the retaining tabs delimit together the central orifice, the respective sharp edges of the free ends of the retaining tabs are configured to establish an electrical contact between the connector and the electrical termination and prevent removal the electrical termination from the connector without irreversible deformation or destruction of at least a part of the connector, when the electrical termination is inserted into the central orifice from the permanent assembly face, and the respective curved edges of the free ends of the retaining tabs are configured to establish an electrical contact between the connector and the electrical termination and allow removal the electrical termination from the connector without damaging the connector, when the electrical termination is inserted into the central orifice from the removable assembly face, wherein the method comprises:

fastening the connector on the printed circuit, at the level of the peripheral area of the connector, the connector being positioned so that its central orifice is opposite to an insertion hole provided in the printed circuit and intended to accommodate the electrical termination;

inserting the electrical termination into the central orifice, to assemble the electrical termination to the connector, and wherein:

the assembly of the electrical termination with the connector is removable such that the electrical termination can be removed from the connector without damaging the connector, when the insertion is carried out from the removable assembly face of the connector, and the assembly of the electrical termination with the connector is permanent such that the electrical termination cannot be removed from the connector without irreversible deformation or destruction of at least a part of the connector, when the insertion is carried out from the permanent assembly face of the connector.

10. The method according to claim 9, wherein each of the retaining tabs further comprises a rim of "V"-shaped section, which attaches the elastically deformable portion of the retaining tab to the free end of the retaining tab.

11. The method according to claim 9, wherein the metal plate is circular.

12. The method according to claim 9, comprising at least three retaining tabs.

13. The method according to claim 9, wherein the retaining tabs are evenly distributed around the central orifice.

14. The method according to claim 9, wherein at least one of the removable assembly face and the permanent assembly face comprises a legend associated with a distinctive sign.

15. The method according to claim 9, wherein the metal plate is made of steel or beryllium copper alloy.

16. The method according to claim 9, wherein:
- the metal plate has a width and a length, when the metal plate has a rectangular parallelepiped shape, or a diameter, when the metal plate has a circular shape, between 2.5 and 4 millimeters;
- the connector has a thickness between 0.1 and 0.4 millimeters;
- the central orifice has an internal diameter between 0.4 and 0.8 millimeters.

\* \* \* \* \*